United States Patent
Wang et al.

(10) Patent No.: US 10,566,151 B1
(45) Date of Patent: Feb. 18, 2020

(54) ITEMS WITH FABRIC DOMES

(71) Applicant: Apple Inc., Cupertino, CA (US)

(72) Inventors: Paul Xiaopeng Wang, Cupertino, CA (US); Siddhartha Hegde, San Jose, CA (US); Daniel D. Sunshine, Sunnyvale, CA (US); Zheng Gao, Cupertino, CA (US)

(73) Assignee: Apple Inc., Cupertino, CA (US)

( * ) Notice: Subject to any disclaimer, the term of this patent is extended or adjusted under 35 U.S.C. 154(b) by 47 days.

(21) Appl. No.: 15/416,177

(22) Filed: Jan. 26, 2017

Related U.S. Application Data

(60) Provisional application No. 62/297,290, filed on Feb. 19, 2016.

(51) Int. Cl.
   *H01H 13/14* (2006.01)
   *H01H 13/52* (2006.01)
   *G06F 3/02* (2006.01)

(52) U.S. Cl.
   CPC ............ *H01H 13/14* (2013.01); *G06F 3/0202* (2013.01); *H01H 13/52* (2013.01); *H01H 2203/0085* (2013.01); *H01H 2215/004* (2013.01); *H01H 2227/022* (2013.01)

(58) Field of Classification Search
   None
   See application file for complete search history.

(56) References Cited

U.S. PATENT DOCUMENTS

| | | | |
|---|---|---|---|
| 5,587,875 A | 12/1996 | Sellers | |
| 6,977,352 B2 | 12/2005 | Oosawa | |
| 7,057,125 B1 | 6/2006 | Tsai | |
| 8,178,808 B2 | 5/2012 | Strittmatter | |
| 2004/0031673 A1 | 2/2004 | Levy | |
| 2006/0036183 A1* | 2/2006 | Sackner | A61B 5/0205 600/481 |
| 2006/0071751 A1 | 4/2006 | Wagner et al. | |
| 2008/0024438 A1* | 1/2008 | Collins | G06F 1/163 345/156 |
| 2010/0315299 A1 | 12/2010 | Bibl et al. | |
| 2012/0012448 A1 | 1/2012 | Pance et al. | |
| 2014/0071654 A1 | 3/2014 | Chien et al. | |
| 2016/0049266 A1 | 2/2016 | Stringer et al. | |

OTHER PUBLICATIONS

Machine translation of KR 100791974 B1 into English; Cho et al. (Year: 2008).*

* cited by examiner

*Primary Examiner* — Brian M Butcher
(74) *Attorney, Agent, or Firm* — Treyz Law Group, P.C.; G. Victor Treyz; Kendall W. Abbasi

(57) ABSTRACT

An item such as a fabric-based item may have one or more input devices. The input devices may have terminals that are electrically coupled to control circuitry. The control circuitry may make resistance measurements, capacitance measurements, and other measurements on the input devices to determine whether the input devices have been pressed by a user's finger or have otherwise received input. The input devices may be used to form an array of switches for a keyboard, may form buttons on an electronic device housing or case, may be part of an item of clothing, or may be incorporated into other items such as fabric-based items. The input devices may have collapsible fabric structures such as collapsible fabric domes. The terminals of the input devices may be formed from conductive strands of material in the fabric domes or may be supported by other structures that buckle under applied pressure.

18 Claims, 22 Drawing Sheets

ITEMS WITH FABRIC DOMES

This application claims the benefit of provisional patent application No. 62/297,290, filed on Feb. 19, 2016, which is hereby incorporated by reference herein in its entirety.

FIELD

This relates generally to fabric structures and, more particularly, to fabric domes and other structures that may be used to form input devices.

BACKGROUND

Keyboards and other electronic devices sometimes include input devices such as switches. For example, each key in a keyboard may have a dome switch and a movable key member that bears against the dome switch when depressed by a user.

If care is not taken, switches and other input devices may be excessively bulky or may not be compatible with the structures used in forming a keyboard or other electronic device of interest.

SUMMARY

An item such as a fabric-based item or other item may have one or more input devices. The input devices may have terminals that are electrically coupled to control circuitry. The control circuitry may make resistance measurements, capacitance measurements, and other measurements on the terminals of the input devices to determine whether the input devices have been pressed by a user's finger or have otherwise received input from a user.

The input devices may serve as switches, force sensors, touch sensors, or proximity sensors. For example, the input devices may serve as switches that have open and closed states. In the open state of an input device, first and second terminals in the device may be separated by an air gap. In the closed state of the input device, a fabric structure in the input device such as a fabric dome or other collapsible structure may buckle under pressure from the user's finger so that the first and second terminals contact each other and form an electrical short circuit.

The input devices may be used to form an array of switches for a keyboard, may form buttons on an electronic device housing or case, may form part of an item of clothing, or may be incorporated into other items such as fabric-based items. The terminals of the input devices may be formed from conductive strands of material in fabric domes or other structures that buckle under applied pressure and that exhibit satisfactory restoring forces when the applied pressure is removed.

DETAILED DESCRIPTION

Figure 1:
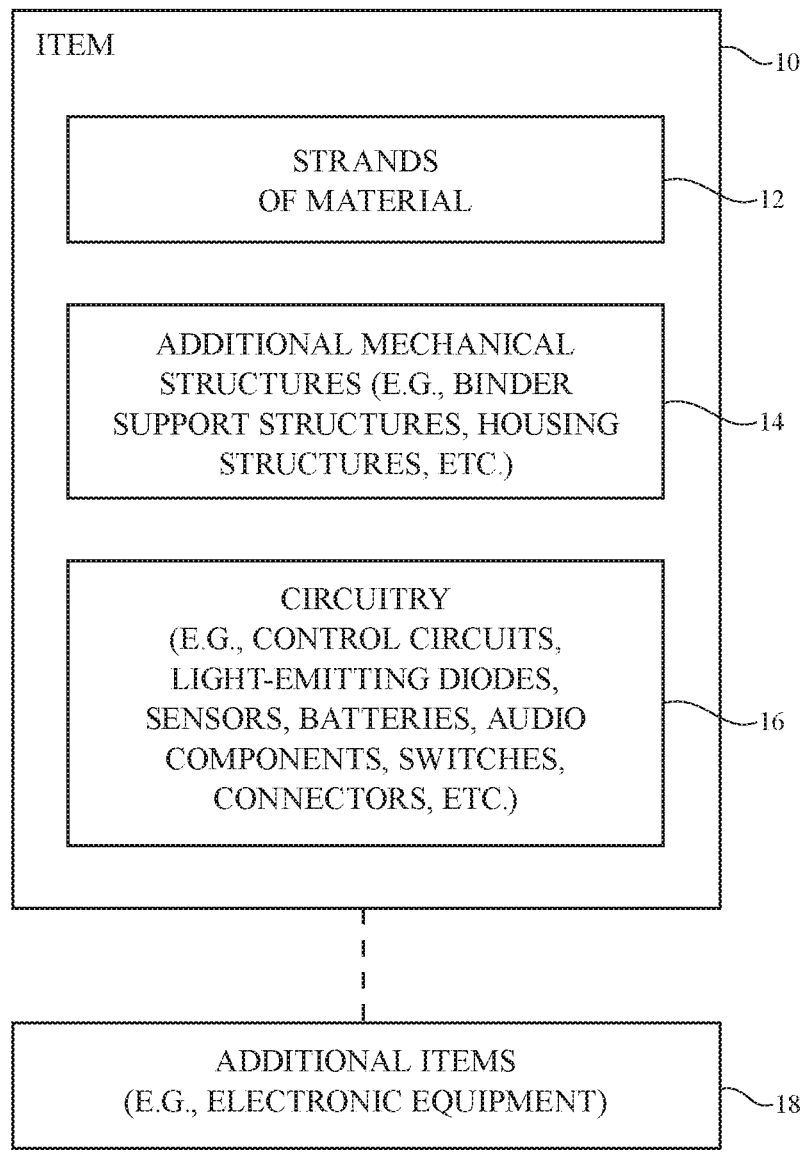
FIG. 1 is a schematic diagram of an illustrative item of the type that may be provided with one or more fabric-based input devices in accordance with an embodiment.

Items such as item 10 of FIG. 1 may include one or more input devices. The input devices may include fabric-based structures that buckle under applied pressure from a finger of a user or other external force. Upon buckling, changes in resistance, capacitance, or other attributes may be detected. The fabric-based structure may exhibit a buckling resistance behavior and corresponding restoring force after buckling that provide the input device with a satisfactory mechanical button behavior. This allows the fabric-based structures to serve as switches in a keyboard or as other input devices.

Item 10 may be a stand-alone electronic device or may be an electronic device or other equipment that serves as an accessory for a stand-alone electronic device. For example, item 10 may be a device such as a laptop computer, a computer monitor containing an embedded computer, a tablet computer, a cellular telephone, a media player, or other handheld or portable electronic device, a smaller device such as a wristwatch device, a pendant device, a headphone or earpiece device, a device embedded in eyeglasses or other equipment worn on a user's head, or other wearable or miniature device, a television, a computer display that does not contain an embedded computer, a gaming device, a keyboard, a pair of earbuds or other device with speakers, a navigation device, an embedded system such as a system in which item 10 is mounted in a kiosk, in an automobile, airplane, or other vehicle, other electronic equipment, or equipment that implements the functionality of two or more of these devices. Item 10 may also be a removable external case for electronic equipment, may be a strap, may be a wrist band or head band, may be a removable cover for a device, may be a case or bag that has straps or that has other structures to receive and carry electronic equipment and other items, may be a necklace or arm band, may be a wallet, sleeve, pocket, or other structure into which electronic equipment or other items may be inserted, may be part of a chair, sofa, or other seating (e.g., cushions or other seating structures), may be part of an item of clothing or other wearable item (e.g., a hat, belt, wrist band, headband, shirt, pants, shoes, etc.), or may be any other suitable item with one or more actuators.

In some arrangements, item 10 may include intertwined strands of material 12 that form fabric. The strands of material in item 10, which may sometimes be referred to herein as yarns, may be single-filament strands (sometimes referred to as fibers or monofilaments) or may be strands of material formed by intertwining multiple monofilaments of material together. The strands of material may be formed from one or more layers of dielectric such as plastic, glass, etc. and/or one or more layers of conductive material such as metal, conductive polymer materials, polymer with sufficient embedded electrically conductive filler material to render the polymer conductive, graphene, or other conductive substances. Strands 12 that include metal may sometimes be referred to as wires.

Fabric formed from strands 12 may form all or part of a housing wall or other layer in an electronic device, may form internal structures in an electronic device, may form clothing, may form a strap, may form a wall for a bag or other enclosure, or may form other fabric-based structures. Item 10 may be soft (e.g., item 10 may have a fabric surface that yields to a light touch), may have a rigid feel (e.g., the surface of item 10 may be formed from a stiff fabric), may be coarse, may be smooth, may have ribs or other patterned textures, and/or may be formed as part of an item that has portions formed from non-fabric structures of plastic, metal, glass, crystalline materials, ceramics, or other materials.

Strands 12 may be formed from polymer, metal, glass, graphite, ceramic, natural materials such as cotton or bamboo, or other organic and/or inorganic materials and combinations of these materials. Conductive coatings such as metal coatings may be formed on non-conductive material. For example, plastic strands 12 in a fabric layer may be coated with metal to make them conductive. Reflective coatings such as metal coatings may be applied to make strands reflective. Strands may be formed from bare metal wires or metal wire intertwined with insulating monofilaments (as examples). Bare metal strands and strands of polymer covered with conductive coatings may be provided with insulating polymer jackets.

Strands 12 may be intertwined to form fabric using intertwining equipment such as weaving equipment, knitting equipment, or braiding equipment. Intertwined strands may, for example, form knitted fabric or woven fabric. Conductive strands and strands with insulating surfaces may be woven, knit, or otherwise intertwined to form conductive paths. The conductive paths may be used in forming signal paths (e.g., signal buses, power lines, control signal interconnects, etc.) and may be used in forming conductive portions of fabric-based input devices such as capacitive touch sensor electrodes, resistive touch sensor electrodes, switch electrodes (sometimes referred to as contacts or terminals), force sensor electrodes, etc. In general, conductive strands 12 in a fabric or other structure may be used in carrying power signals, digital signals, analog signals, sensor signals, control signals, data, input signals, output signals, or other suitable electrical signals.

Item 10 may include additional mechanical structures 14 such as polymer binder to hold strands 12 in a fabric or other structure together, support structures such as frame members, housing structures (e.g., an electronic device housing), layers of material that overlap fabric structures and/or that support fabric structures, and other mechanical structures.

To enhance mechanical robustness and electrical conductivity at strand-to-strand connections, additional structures and materials 14 (e.g., solder, crimped metal connections, welds, conductive adhesive such as anisotropic conductive film and other conductive adhesive, non-conductive adhesive, fasteners, etc.) may be used to help form strand-to-strand connections. These strand-to-strand connections may be formed where strands 12 cross each other perpendicularly or at other strand intersections where connections are desired. Insulating material can be interposed between intersecting conductive strands at locations in which it is not desired to form a strand-to-strand electrical connection. The insulating material may be plastic or other dielectric, may include an insulating strand or a conductive strand with an insulating coating, etc. Solder connections may be formed between conductive strands by melting solder so that the solder flows over conductive strands. The solder may be melted using an inductive soldering head to heat the solder, using a reflow oven to heat the solder, using a laser or hot bar to heat the solder, or using other soldering equipment. During soldering, outer dielectric coating layers (e.g., outer polymer layers) may be melted away in the presence of molten solder, thereby allowing underlying metal strands to be soldered together.

Item 10 may include circuitry 16. Circuitry 16 may include electrical components that are coupled to fabric or other structures formed from strands 12, electrical components that are housed within an enclosure that includes fabric or other structures formed from strands 12, electrical components that are attached to fabric formed from strands 12 using welds, solder joints, conductive adhesive bonds, crimped connections, or other electrical and/or mechanical bonds, and electrical components mounted in electronic device housings formed from plastic, glass, metal, fabric, and/or other materials. Circuitry 16 may include metal structures for carrying current, electrical devices such as integrated circuits, light-emitting diodes, sensors, and switches, and other electrical components. Circuitry 16 may include one or more input devices such as input devices formed from fabric domes or other fabric-based input devices formed using strands 12. Control circuitry in circuitry 16 may use signals from the input devices in controlling the operation of item 10.

Item 10 may interact with electronic equipment or other additional items 18. Items 18 may be attached to item 10 or item 10 and item 18 may be separate items that are configured to operate with each other (e.g., when one item is a case and the other is a device that fits within the case, when one item is a wrist watch or pendant device and the other item is a strap for the item, etc.). Control circuitry in circuitry 16 may be used to support communications with item 18 and/or other devices. Circuitry 16 may include antennas and other structures for supporting wireless communications with item 18. Item 18 may also interact with item 10 using a wired communications link or other connection that allows information to be exchanged.

In some situations, item 18 may be an electronic device such as a cellular telephone, computer, or other portable electronic device and item 10 may form a cover (e.g., a cover including a keyboard and/or other buttons or a cover that does not include a keyboard), a case, a bag, an item of clothing, or other structure that receives the electronic device in a pocket, an interior cavity, or other portion of item 10. In other situations, item 18 may be a wristwatch device or other electronic device and item 10 may be a strap or other fabric-based item that is attached to item 18 (e.g., item 10 and item 18 may together form a fabric-based item such as a wristwatch with a strap). In still other situations, item 10 may be an electronic device, fabric formed from strands 12 may be used in forming the electronic device and/or input devices or other structures in item 10, and additional items 18 may include accessories or other devices that interact with item 10. Signal paths formed from conductive strands may be used to route signals in item 10 and/or item(s) 18. Signal paths may also be formed using patterned metal traces in printed circuits, metal traces patterned onto fabric, and/or other conductive paths item 10.

The fabric that makes up the input devices and other structures in item 10 may be formed from multifilament and/or monofilament yarns that are intertwined using any suitable intertwining equipment (knitting equipment, weaving equipment, braiding equipment, equipment for forming felt, etc.). The fabric may be knitted, woven, braided, or otherwise formed from intertwined strands 12. Woven fabric may have a plain weave, a basket weave, a satin weave, a twill weave, or variations of these weaves, may be a three-dimensional woven fabric, or may be other suitable fabric. Knitted fabric may be weft knitted or warp knitted.

Figure 2:
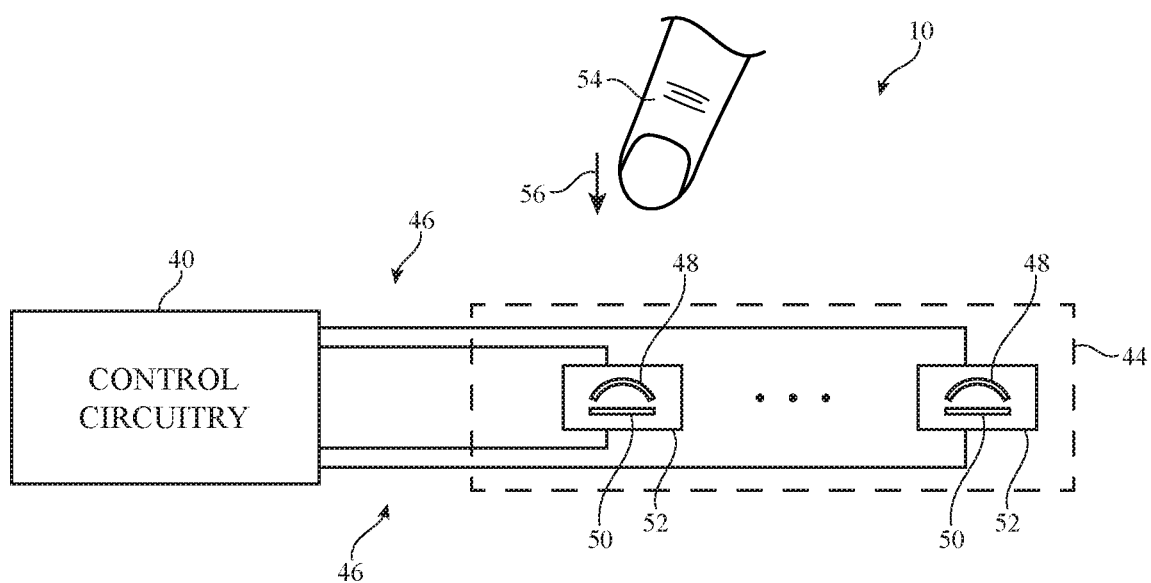
FIG. 2 is a diagram of an illustrative fabric-based input device and associated control circuitry in accordance with an embodiment.

As shown in FIG. 2, item 10 may include input devices 52. Input devices 52 may be formed from strands of material 12 and/or other structures in item 10 such as structures 14. There may be one or more input devices 52 in item 10. As shown in the example of FIG. 2, a component such as device 44 may be provided with multiple input devices 52. An array of input devices 52 may form a keyboard, multiple input devices 52 may be used in forming a keypad, multiple input devices 52 may be used in forming a row of buttons, etc.

Circuitry 16 of item 10 may include control circuitry 40. Input-devices 52 may be electrically coupled to control circuitry 40 of using signal paths 46. Paths 46 may be conductive strands in a fabric, may be metal traces on a printed circuit, may be conductive traces on a fabric, and/or may be other conductive paths in item 10. Control circuitry 40 may apply signals to devices 52 using paths 46 and may measure associated signals from devices 42 using paths 46. Resistance measurements may be used by control circuitry 40 in determining the state of devices 52, capacitance measurements may be used by control circuitry 40 in determining the state of devices 52, or other types of measurements may be made on devices 52 by control circuitry 40 to determine whether input is being supplied to devices 52 by a user. Devices 52 may form resistance-based switches (e.g., switches that have open or closed states as determined by their resistance), may form capacitive switches (e.g., switches that are determined to be activated or not activated based on measured changes in capacitance), may form force-based input devices (e.g., input devices that use capacitive measurements, strain gauge measurements, or other types of force measurements to detect different amounts of applied force), may form touch-based input devices (e.g., capacitive touch sensors that measure capacitance changes when touched by a finger of a user), or may form other types of input devices.

Each device 52 may have a pair of terminals (sometimes referred to as electrodes) such as terminals 48 and 50. Terminals 48 and 50 and/or other structures that form each device 52 may have any suitable shape. Preferably, the shapes of terminals 48 and 50 and/or the other structures of device 52 such as supporting structures are configured to allow some or all of device 52 to buckle when pressure is applied by an external object such as a user's finger (see, e.g., finger 54 of FIG. 2) in direction 56. With one illustrative configuration, terminals 48 may be dome shaped and terminals 50 may be planar, but other buckling structures may be used for forming devices 52 if desired.

In a resistance-based switch, circuitry 40 may measure the resistance between terminals 48 and 50. When terminal 48 has an unbuckled dome shape, terminals 48 and 50 may be separated by an air gap. When terminals 48 and 50 are separated in this way, input device 52 will form an open circuit (i.e., the resistance-based switch will be open). When terminal 48 is pressed downwards in direction 56 by finger 54, terminal 48 or structures associated with terminal 48 may buckle, thereby allowing terminal 48 to contact terminal 50. In this situation, input device 52 will form a low-resistance closed circuit (i.e., the resistance-based switch will be closed). In other device configurations such as capacitance-based or strain-gauge based systems, capacitance measurements, strain gauge measurements, or other measurements may be made by circuitry 40 to detect whether a dome or other collapsible structure in device 52 has or has not buckled under pressure from finger 54.

Input devices 52 (e.g., electrode 48, electrode 50, and/or other structures in input devices 52) may be formed from strands 12. Strands 12 may include insulating strands (e.g., strands that are formed from a single polymer core and/or that are formed from a polymer core coated with one or more polymer coating layers, or other dielectric strands). Strands 12 may also include conductive materials so that they can conduct current. Illustrative conductive strands 12 (i.e., strands that include one or more conductive materials) are shown in FIGS. 3, 4, 5, and 6. Other types of arrangement may be used in forming conductive strands 12 if desired. The examples of FIGS. 3, 4, 5, and 6 is merely illustrative.

Figure 3:
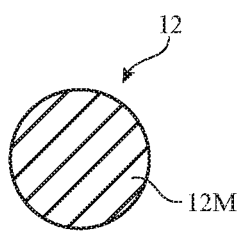
FIGS. 3, 4, 5, and 6 are cross-sectional side views of illustrative strands of material that may be used in forming a fabric-based input device in accordance with an embodiment.
Figure 4:
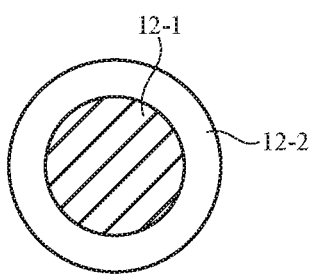
Figure 5:
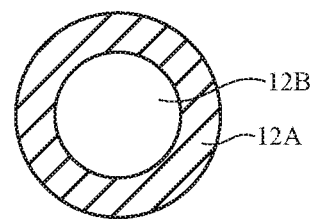

As shown in the illustrative cross-sectional side view of conductive (conducting) strand 12 of FIG. 3, conductive strand 12 may be formed from a solid conductive material such as core 12M (e.g., strand 12 may be formed from an elemental metal or a metal that is an alloy). FIG. 4 shows how strand 12 may have a coating layer such as coating 12-2 on a core such as core 12-1. Core 12-1 may be a metal or other conductive material and coating 12-2 may be a polymer or other dielectric. In the example of FIG. 5, strand 12 has a coating layer such as coating layer 12B on a core such as core 12A. Core 12A may be a polymer or other dielectric and coating 12B may be metal or other conductive material. Configurations in which the core and coating of a two layer conductive strand are both formed from metal or other conductive material may also be used (e.g., both portions 12A and 12B of strand 12 of FIG. 5 may be metal). In the illustrative configuration of FIG. 6, conductive strand 12 has three portions: 12A, 12B, and 12C. Core 12A, may be formed from metal or may be formed from polymer or other dielectric, inner coating 42B may be formed from metal or may be formed from polymer or other dielectric, and outer coating 42C may be formed from metal or may be formed from polymer or other dielectric. Additional coating layers of polymer and/or metal may also be formed on the layers of strand 12 in FIG. 6. One or more, two or more, or three or more of the layers of material in strand 12 of FIG. 6 may be formed from a conductive material such as metal (elemental or alloy) so that current may pass through strand 12 of FIG. 6.

Figure 6:
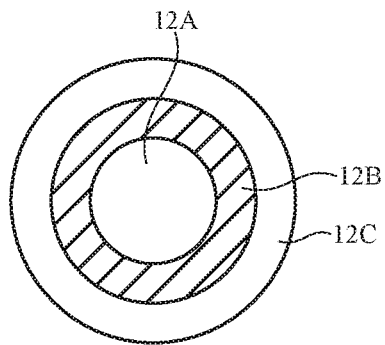

In configurations for input device 52 in which device 52 serves as a switch and in which the switch closes due to bare metal contact between a pair of terminals (e.g., upper and lower electrodes), the strands for forming the terminals may have outer surfaces that are formed from metal or, in the situation in which the outer coatings of the strands are insulating, the insulating outer strand coatings such as selected portions of an insulating coating 12-2 of FIG. 4 and selected portions of an insulating coating 12C of FIG. 6 may be removed so that the outer surface of the strands is conductive.

Figure 7:
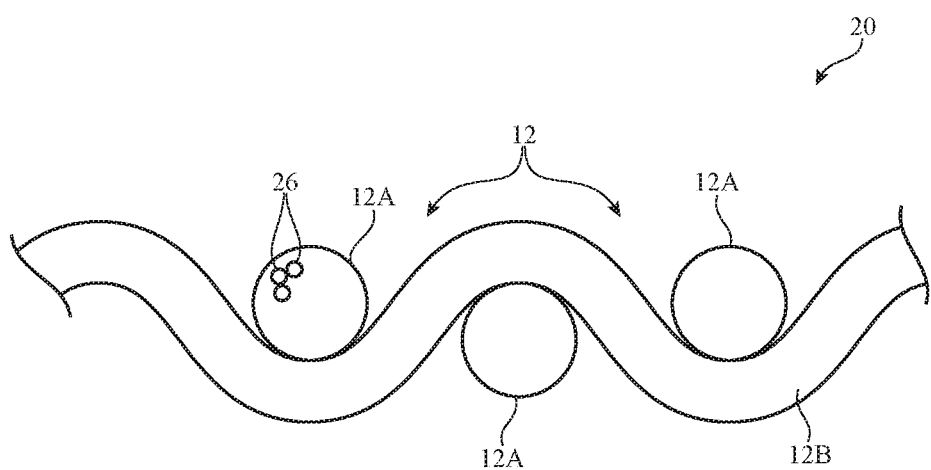
FIG. 7 is a cross-sectional side view of a layer of woven fabric in accordance with an embodiment.
Figure 8:
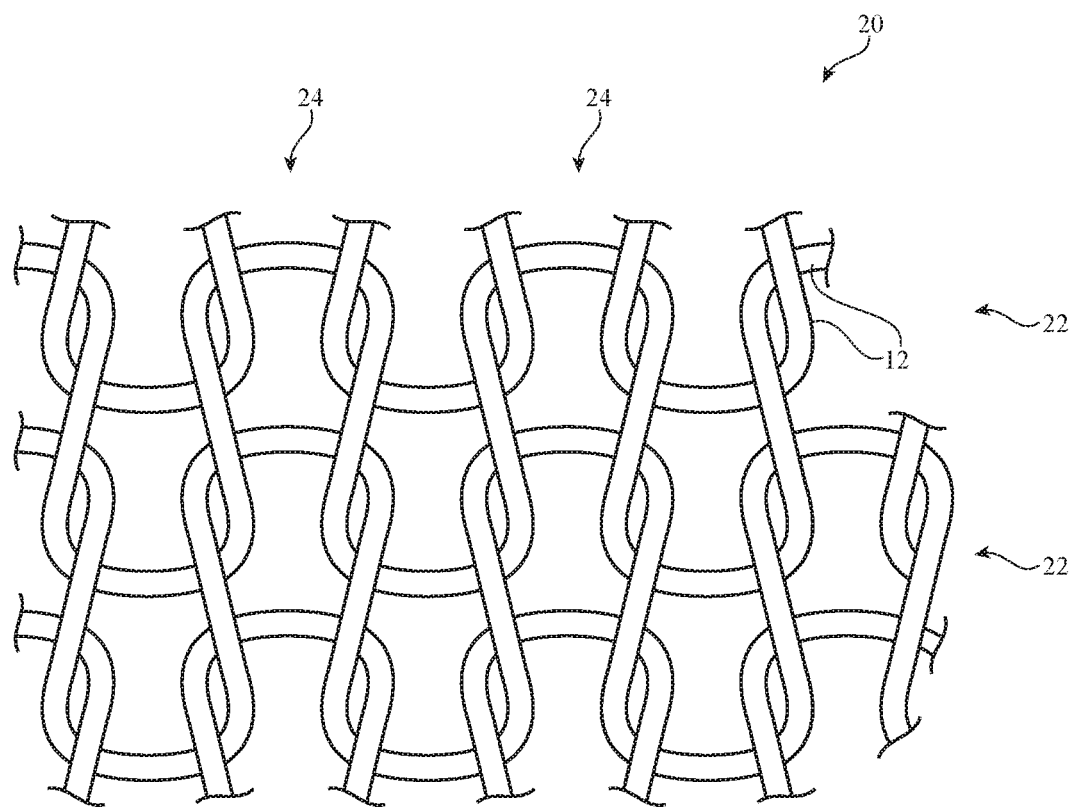
FIG. 8 is a top view of an illustrative layer of knit fabric in accordance with an embodiment.

All or part of devices 52 and/or other structures in item 10 may be formed by intertwining strands 12 (conductive and/or insulating) to form fabric. FIGS. 7 and 8 show illustrative fabrics that may be formed from strands 12.

Fabric 20 of FIG. 7 is a woven fabric formed from strands 12. Strands 12 may include warp strands 12A and weft strands 12B. Each strand 12 may contain one or more monofilaments of material (see, e.g., illustrative monofilament strands 26). As shown in FIG. 8, fabric 20 may be a knit fabric. In the illustrative configuration of FIG. 8, fabric 20 has a single layer of knit strands 12 that form horizontally extending rows of interlocking loops (courses 22) and vertically extending wales 24.

The fabric that is formed from strands 12 may have dome structures and other structures that form parts of input devices 52. The examples of FIGS. 7 and 8 are illustrative. Other fabric constructions may be used for fabric in devices 52 (e.g., electrode 48, electrode 50, other structures such as other buckling structures, etc.) and/or other portions of item 10 if desired.

Figure 9:
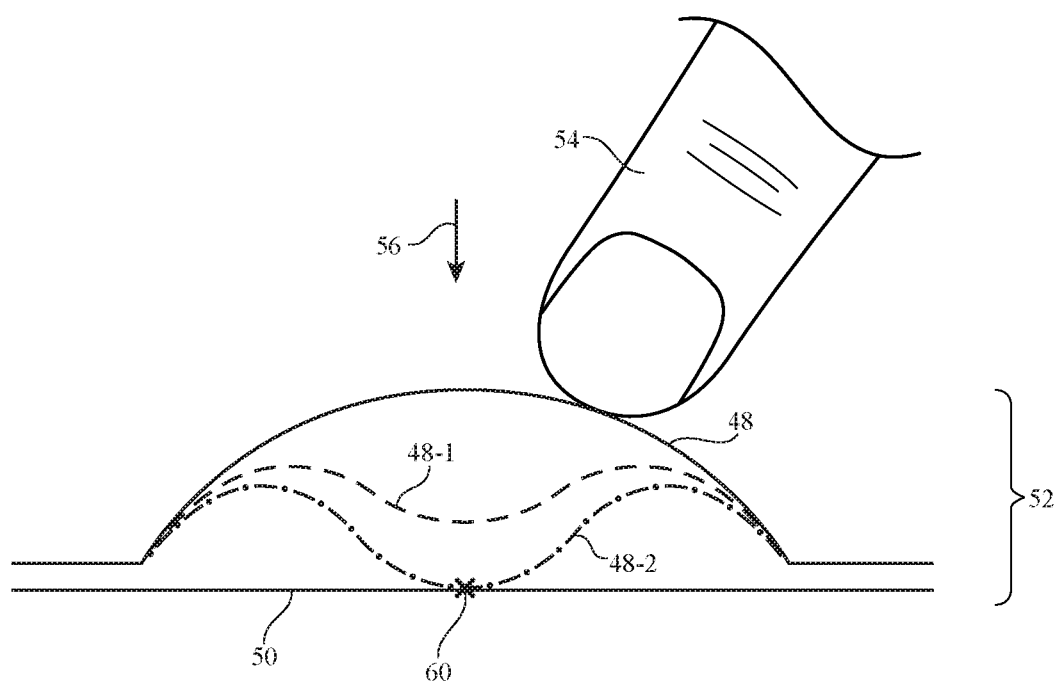
FIG. 9 is a cross-sectional side view of an illustrative fabric dome in accordance with an embodiment.

The operation of an illustrative input device with a buckling (compressible) upper electrode is shown in FIG. 9. In the example of FIG. 9, electrode 48 has a curved cross-sectional shape in the absence of pressure from finger 54 in direction 54. Electrode 48 may, for example, have a half-cylinder shape or a hemispherical dome shape. When pressed downwards in direction 56, electrode 48 buckles and takes on shape 48-1. Further pressure may cause electrode 48-1 to contact electrode 50 at electrical connection 60. Due to the buckling nature of the structure that is being pressed by finger 54 (i.e., the structure forming electrode 48 in the FIG. 9 example), downward pressure is initially met with substantial resistance that weakens once buckling starts. When pressure is released, the buckled structure will assertively spring back towards its original position. This type of compression and spring-back behavior helps provide a desired tactile response for device 52 (i.e., the use of a dome or other buckling structure in device 52 allows device 52 to be used as a keyboard key, button, or other device that operates under pressure from a user's finger).

During operation of device 52, deflection of electrode 48 to position 48-1 may be detected using capacitance measurements (e.g., measurements of the changing capacitance between electrodes 48 and 50 as electrode 48 deflects from its original position) or resistance measurements (e.g., measurements that reveal whether electrodes 48 and 50 are isolated from each other by an intervening air gap or are shorted to each other at connection 60). Configurations in which strain gauges or other sensors are used to support the operation of devices 52 may also be used.

Figure 10:
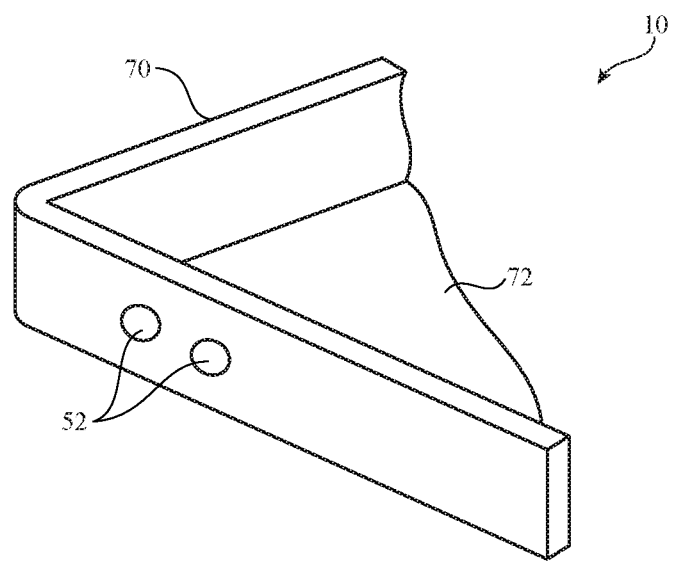
FIG. 10 is a perspective view of an illustrative electronic device case having buttons formed from fabric domes in accordance with an embodiment.

Dome-shaped structures such as fabric domes or other collapsible structures may be used in forming switches and other input devices 52. For example, electrodes such as electrode 48 may be formed from conductive strands 12 in a fabric dome or other structure that buckles under pressure from finger 54. In the example of FIG. 10, input devices 52 have been formed on walls 70 of item 10 (e.g., fabric electronic device housing walls, walls of a removable fabric case for a cellular telephone, tablet computer, or other device, or other structures formed from fabric and/or other materials). Input devices 52 may form volume control buttons, on-off buttons, sleep/wake buttons, menu buttons, or other buttons. Walls 70 may be sidewalls and may be coupled to other walls in item 10 such as rear housing wall 72 or a front housing wall. If desired, input devices 52 based on fabric domes or other collapsible fabric structures may be formed on walls such as wall 72 or a front housing wall.

Figure 11:
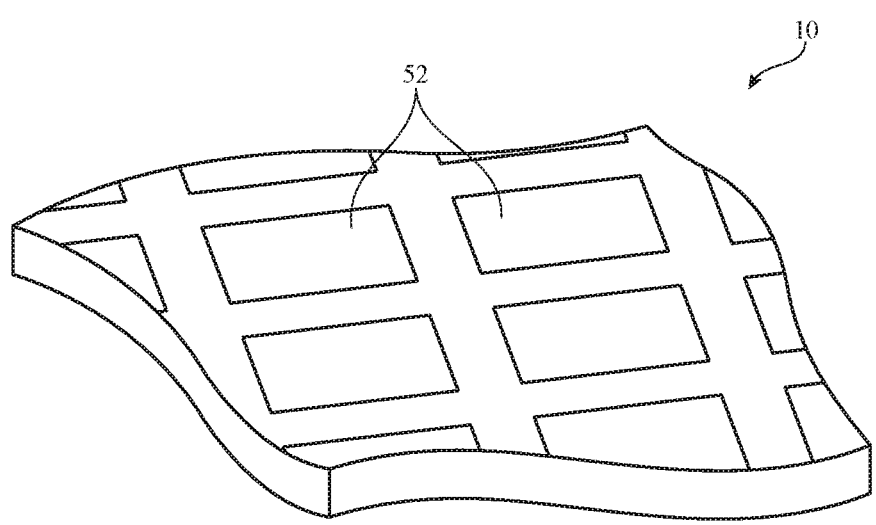
FIG. 11 is a perspective view of a portion of a keyboard with fabric-based input devices such as keys formed from fabric overlapping fabric dome switches in accordance with an embodiment.

As shown in the perspective view of illustrative item 10 of FIG. 11, item 10 may be a keyboard or other device that includes an array of input devices 52. Input devices 52 may be, for example, labeled keys in a keyboard, keys in a key pad, buttons in a group of buttons on item 10, etc. Each input device 52 in item 10 of FIG. 11 may have a buckling structure such as a collapsible fabric dome, a buckling fabric structure with another shape, or other collapsible structure.

Figure 12:
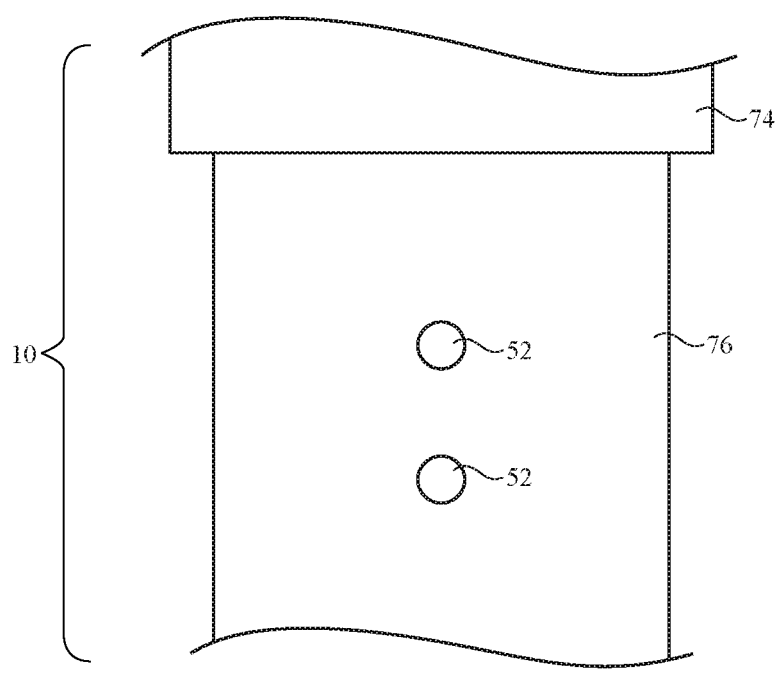
FIG. 12 is a top view of an illustrative fabric structure such as a band or strap that has been provided with input devices such as switches based on fabric domes in accordance with an embodiment.

In the example of FIG. 12, item 10 is a watch having an electrical device portion such as watch unit 74 and having an associated strap such as strap 76. Strap 76 may be formed from fabric that includes strands 12 and may have signal paths formed from strands 12 or other structures that are coupled to control circuitry in unit 74. Input devices 52 may be formed on strap 76 and may include fabric dome structures or other collapsible structures (e.g., strap 76 and/or input devices 52 may be formed from strands 12). Input devices 52 may gather input that is provided to the control circuitry in unit 74.

Figure 13:
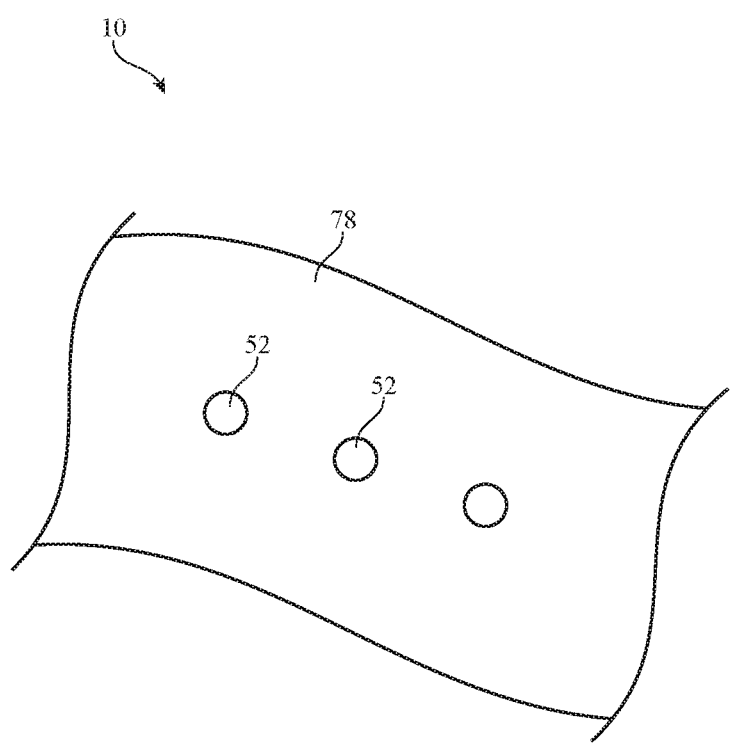
FIG. 13 is a perspective view of an illustrative fabric structure such as a portion of a shirt, jacket, or other item of clothing with fabric dome input devices in accordance with an embodiment.

If desired, item 10 may be an item of clothing. As shown in FIG. 13, an item of clothing such as item 10 of FIG. 13 may include fabric 78 with one or more input devices 52. Devices 52 may be mounted on the exterior of a shirt, jacket, or pair of pants, may be mounted in the interior of a garment, or may be incorporated into other clothing items formed from fabric 78.

Figure 14:
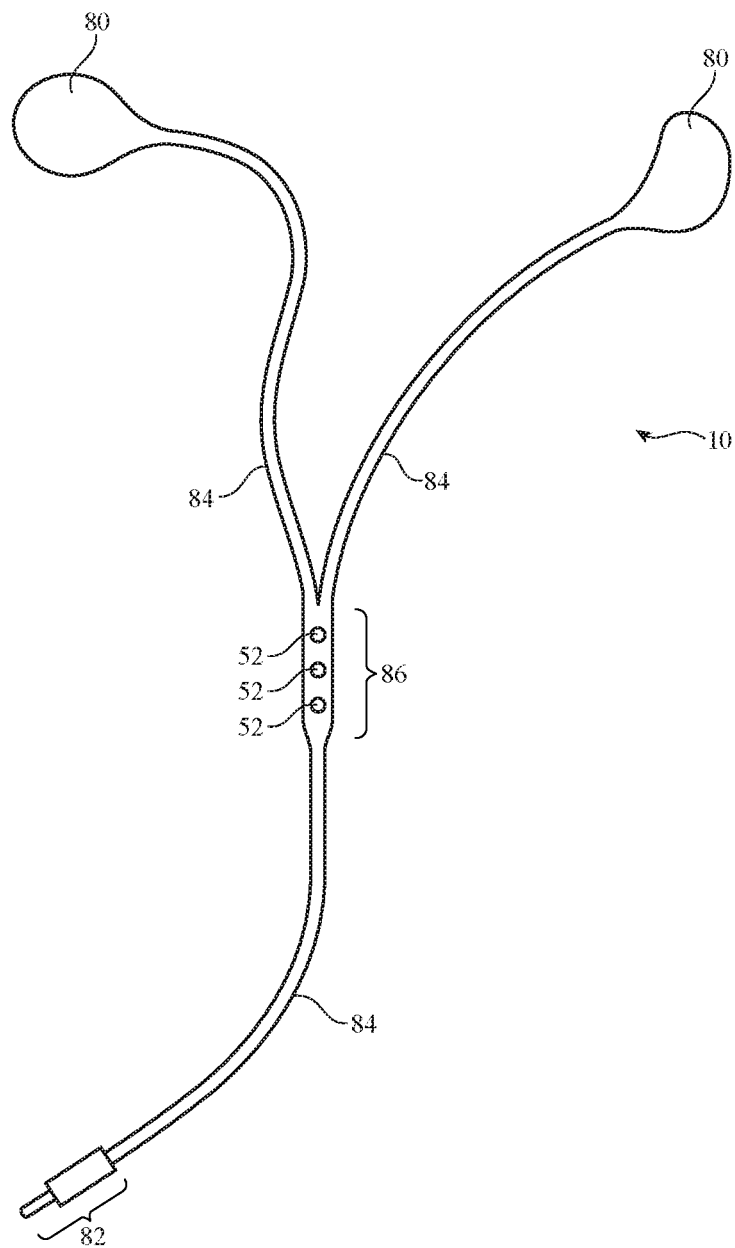
FIG. 14 is a perspective view of an illustrative pair of earbuds with input devices based on fabric domes in accordance with an embodiment.

In the example of FIG. 14, item 10 is an accessory such as a pair of headphones (earbuds). Item 10 may have earbuds 80 with speakers for producing sound for a user and may have cables 84 that couple electrical connector 84 (e.g., an audio jack, etc.) to earbuds 80. Portion 86 of item 10 may be interposed along the length of cables 84 and may form a button controller for item 10. Portion 86 may include one or more input devices 52. Item 10 may include fabric. For example, devices 52 may have fabric domes or other collapsible structures and may be formed from fabric structures in portion 86, cables 84, and/or earbuds 80. Devices 52 may form buttons for advancing or rewinding audio tracks, for pausing or stopping media playback, for adjusting volume, etc.

Figure 15:
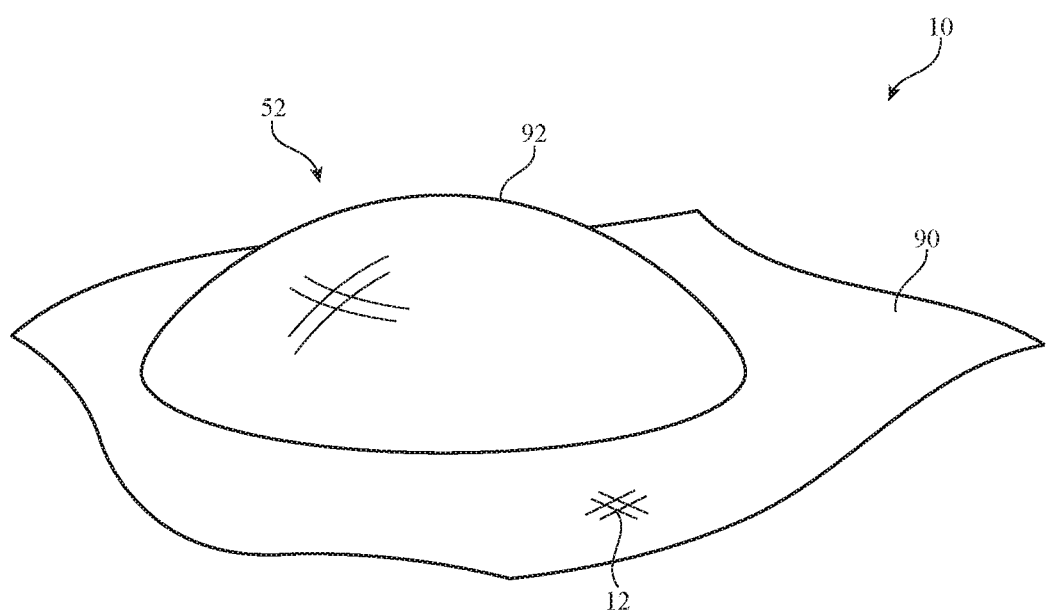
FIG. 15 is a perspective view of an illustrative fabric dome for an input device such as a switch in accordance with an embodiment.

A perspective view of an illustrative fabric dome structure for device 52 of item is shown in FIG. 15. In the example of FIG. 15, fabric dome 92 for device 52 is formed on layer 90 (i.e., fabric dome 92 and layer 90 may be formed from a common set of intertwined strands of material such as strands 12). Configurations in which layer 90 is formed from a polymer layer, a structure formed from metal, polymer, or other material, or in which other support structures 90 are used in place of a fabric layer under dome 92 may also be used.

Figure 16:
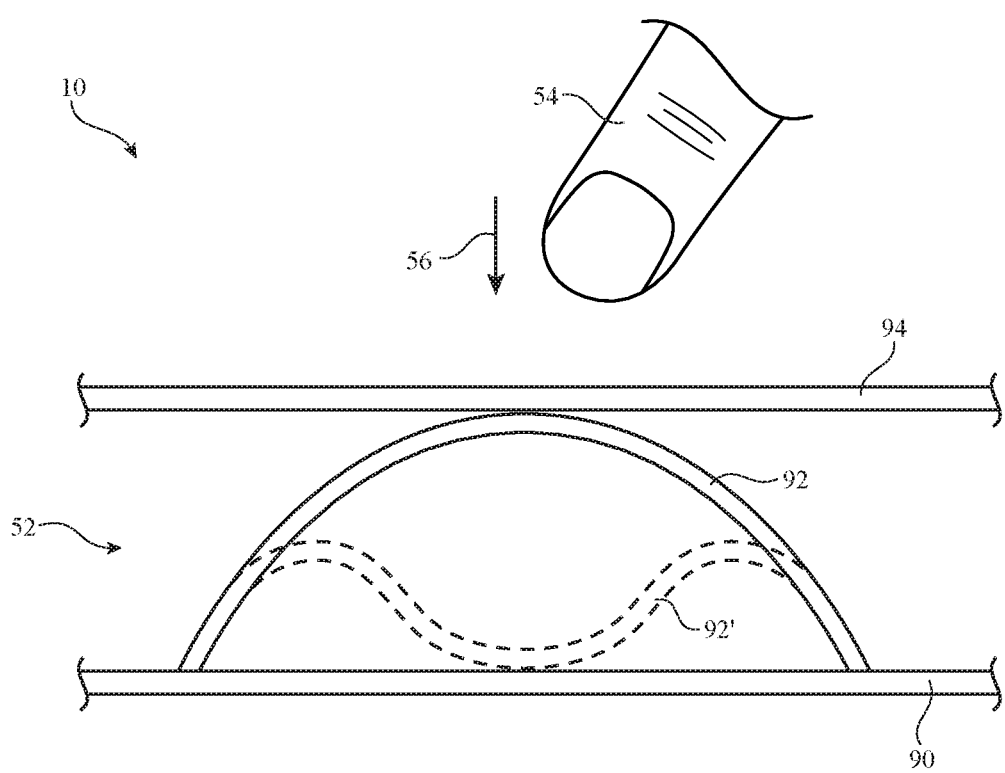
FIG. 16 is a cross-sectional side view of an illustrative fabric dome input device having a fabric dome structure interposed between a flexible cover layer and a supporting structure in accordance with an embodiment.

Fabric dome structures for device 52 and other collapsible structures for device 52 may include conductive strands 12 or other conductive materials that form some or all of electrodes 48 and 50. In the arrangement of FIG. 15, fabric dome 92 of input device 52 is uncovered by any additional layers of material. If desired, fabric dome 92 may be covered by additional layer(s) of material. For example, item 10 may have an outer surface formed by a layer such as layer 94 of FIG. 16 that overlaps fabric dome 92. Layer 94 may be a layer of plastic, leather, fabric, or other material and may form the exterior surface in a keyboard or other item. Fabric dome 92 may form part of layer 90 and/or layer 94 and may form input device 52.

Figure 17:
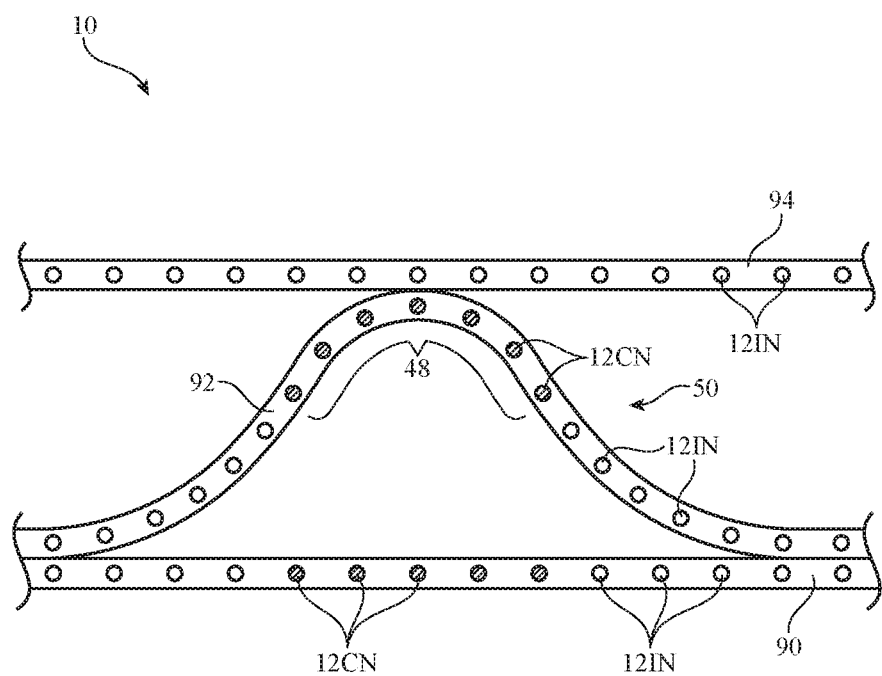
FIG. 17 is a cross-sectional side view of a fabric dome showing how selected portions of the fabric dome may be provided with conductive strands that form terminals for an input device in accordance with an embodiment.

When a user's finger such as finger 54 presses downwards on layer 94, fabric dome 92 may buckle into position 92', so that dome 92 contacts layer 90. Electrode 48 may be a metal layer or other conductive structure that is supported by fabric dome 92 and/or may be formed from conductive strands 12 that are part of fabric dome 92. Electrode 50 may likewise be a metal layer or other conductive structure that is supported by layer 90 under dome 92 and/or may be formed from conductive strands 12 that are part of layer 90. As shown in FIG. 17, for example, layer 94 may have insulating strands 12IN, fabric dome 92 may be formed from insulating strands 12IN and conducting strands 12CN that form electrode 48, and layer 90 may be formed from insulating strands 12IN and conducting strands 12CN that form electrode 50.

Figure 18:
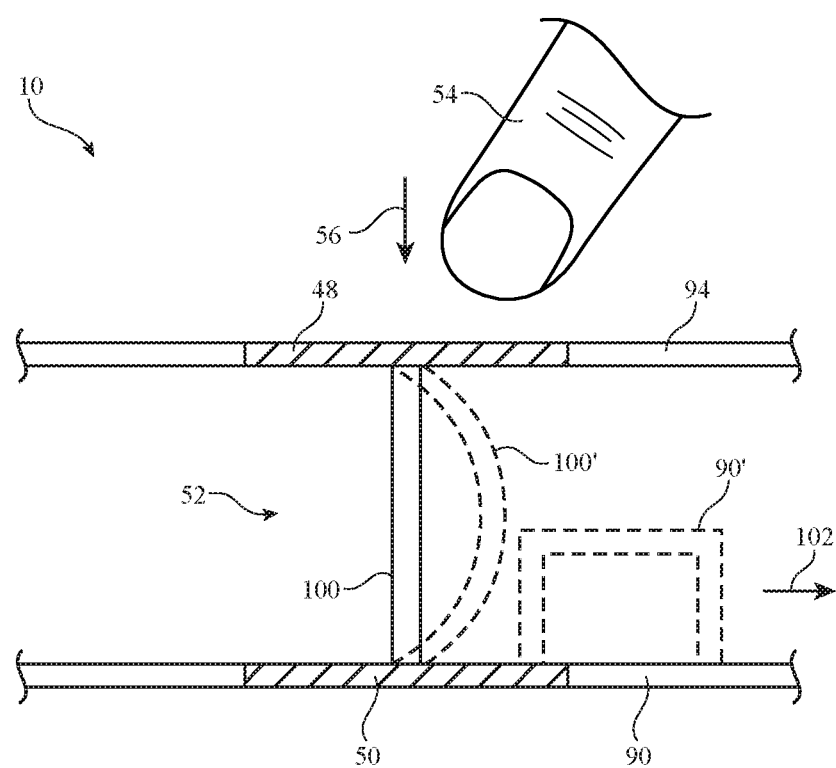
FIG. 18 is a cross-sectional side view of an illustrative fabric-based input device with a post-shaped buckling fabric structure in accordance with an embodiment.

If desired, buckling structures for input device 52 may be formed from fabric posts such as collapsible post 100 of input device 52 of item 10 in FIG. 18. Electrode 48 may be formed in upper layer 94 (e.g., a fabric layer) and electrode 50 may be formed in lower layer 90 (e.g., a fabric layer). Post 100 may be surrounded by air, so that post 100 may easily buckle under pressure. When pressure is applied by finger 54 in direction 56, post 100 may buckle into position 100' to allow electrodes 48 and 50 to contact each other or to allow portions of post 100 to contact other structures such as structure 90', which may be a part of a fabric layer such as layer 90 or other fabric support structure. As an example, electrode 48 may be formed from conductive strands 12 in post 100 and electrode 50 may be formed from conductive strands 12 in portion 90' of layer 90. In this type of arrangement, the supporting structure of device 52 such as post 100 that forms electrode 48 may buckle and move in direction 102 into electrical contact with portion 90' of layer 90 that forms electrode 50 when finger 54 presses downwardly (e.g., inwardly towards the interior of item 10) in direction 56. Other structures (e.g., other fabric structures and/or other structures formed from strands 12) may be used in forming electrodes that move towards each other and away from each other in response to the application and removal of finger 54. The buckling support post arrangement of FIG. 18 is merely illustrative.

Figure 19:
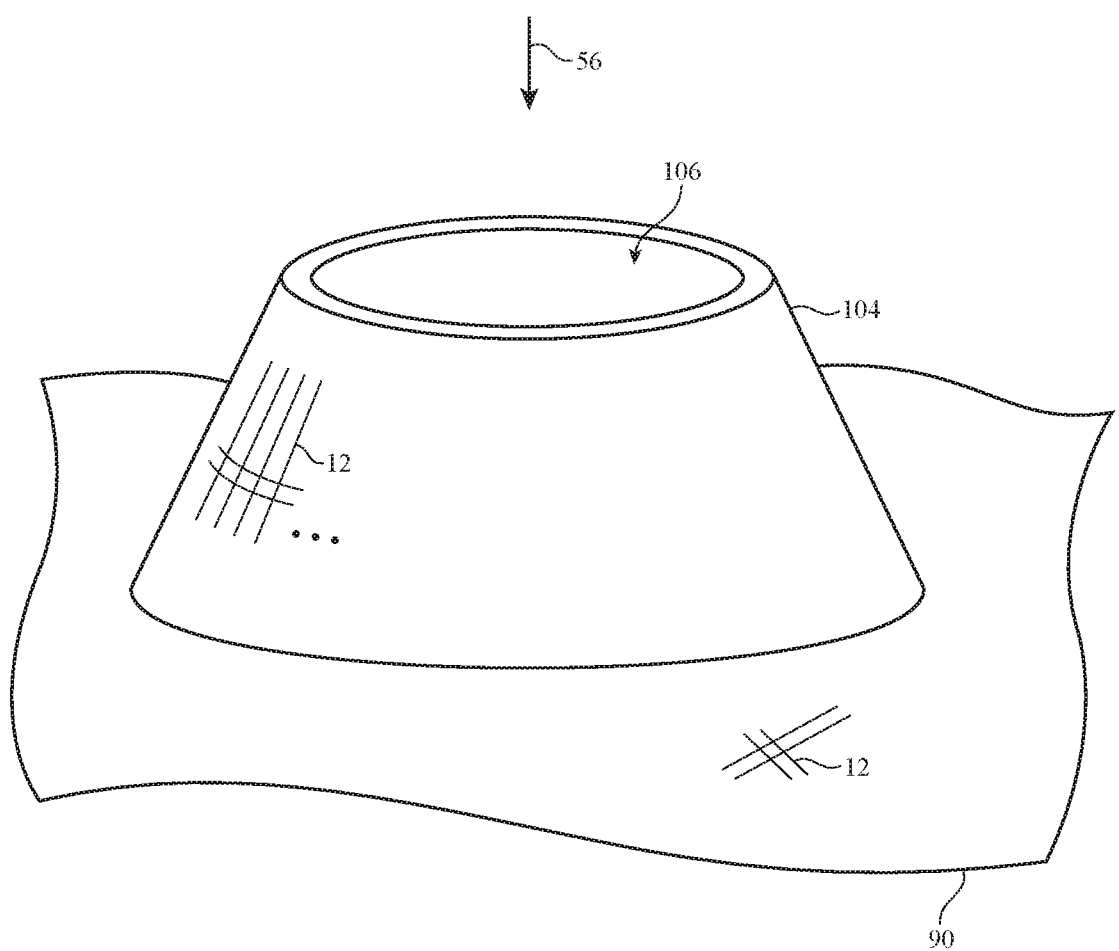
FIG. 19 is a perspective view of an illustrative open-topped fabric cone for a fabric-based input device in accordance with an embodiment.

FIG. 19 is a perspective view of an illustrative bucking structure formed from an open-topped fabric cone. Fabric cone 104 may be formed from strands 12 and may be formed as a portion of layer 90 or may be attached to layer 90. Layer 90 may be formed from strands 12 or other material. Opening 106 at the top of cone 104 may be circular or may have other suitable shapes. If desired, a fabric layer or other layer of material such as layer 94 (see, e.g., FIGS. 17 and 18) may overlap cone 104. When pressed in direction 56, an electrode formed on the overlapping layer or the upper part of cone 104 (e.g., electrode 48) may contact an electrode formed in a support structure such as layer 90 (e.g., electrode 50).

Figure 20:
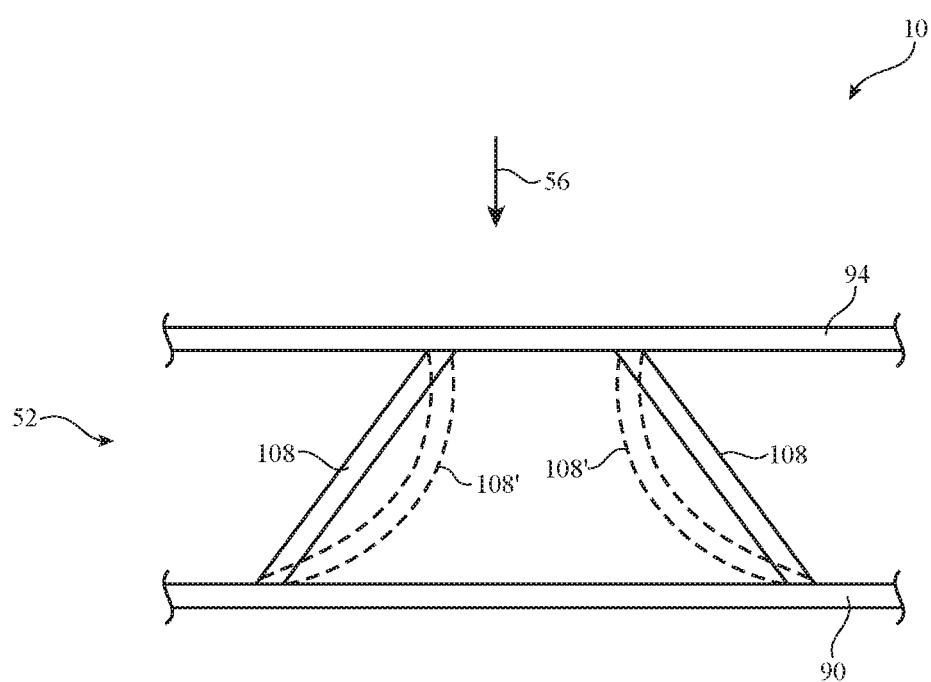
FIG. 20 is a cross-sectional side view of an illustrative fabric-based input device such as a fabric-based input device including a fabric cone of the type shown in FIG. 19 in accordance with an embodiment.

FIG. 20 is a cross-sectional side view of device 52 in an illustrative configuration in which an open-topped cone or other structure with buckling diagonal support structures 108 has been formed between layers 90 and 94. Layers 94, structures 108, and layer 90 may be formed from intertwined strands 12. When pressed in direction 56, structures 108 may buckle inwardly towards positions 108'. Electrode 48 may be formed from conductive strands in layer 94, portions of structure 108 or elsewhere in the structures of FIG. 20 and electrode 50 may be formed from conductive strands in layer 90 under structure 108 or elsewhere in the structures of FIG. 20. Electrodes 48 and 50 may come into contact with each other when input device 52 of FIG. 20 is pressed in direction 56 (as an example).

Figure 21:
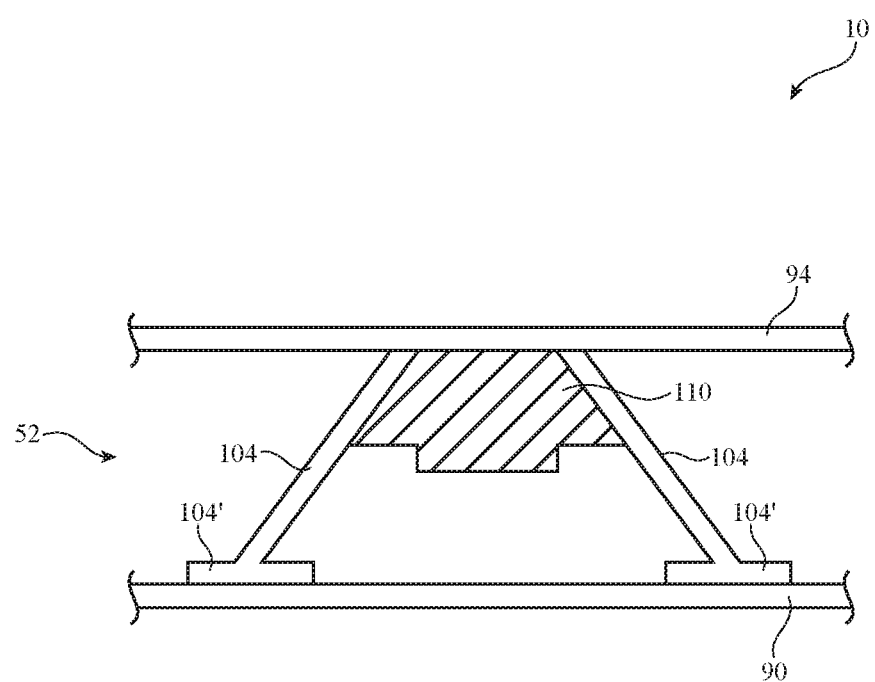
FIG. 21 is a cross-sectional side view of an illustrative fabric-based input device in accordance with an embodiment.

If desired, a structure such as structure 110 of FIG. 21 may be incorporated into the upper portion of cone 104 Structure 110 may be formed from strands 12 that form an integral portion of both one 104 and structure 110 or structure 110, may be formed from a separate piece of polymer, or may be formed from other structures. Structure 110 may be rigid (e.g., to limit key travel for device 52 in a configuration where the portion of layer 94 overlapping device 52 forms a labeled key structure for a key in a keyboard), may be elastomeric (e.g., structure 110 may be foam, may be a soft polymer such as silicone, etc.), may have a combination of flexible and rigid structures, may have conductive portions (e.g., conductive strands 12 and/or other conductive material for forming electrode 48), etc. Cone 104 or other buckling structures for device 52 may, if desired, have horizontally base portions such as base structure 104'.

Figure 22:
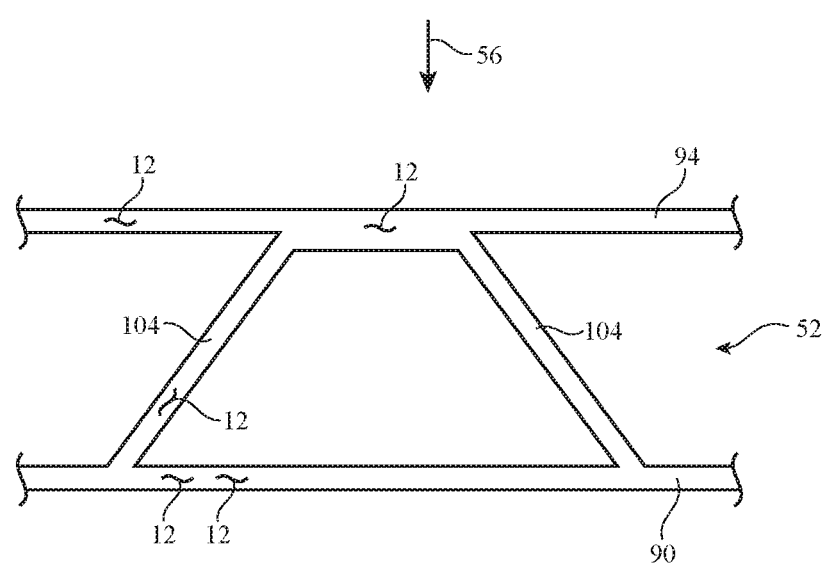
FIG. 22 is a cross-sectional side view of an illustrative fabric-based input device that includes a flat-topped fabric structure such as a cone in accordance with an embodiment.

As illustrated in the cross-sectional side view of device 52 of FIG. 22, cone-shaped support structures 104 or other buckling support structures for device 52 that buckle when pressed in direction 56 may be formed from fabric that also forms portions of layers 90 and 94 (i.e., intertwined strands 12 may form cone 104, layer 90, and layer 94 and these structures may represent portions of an integral fabric structure).

Figure 23:
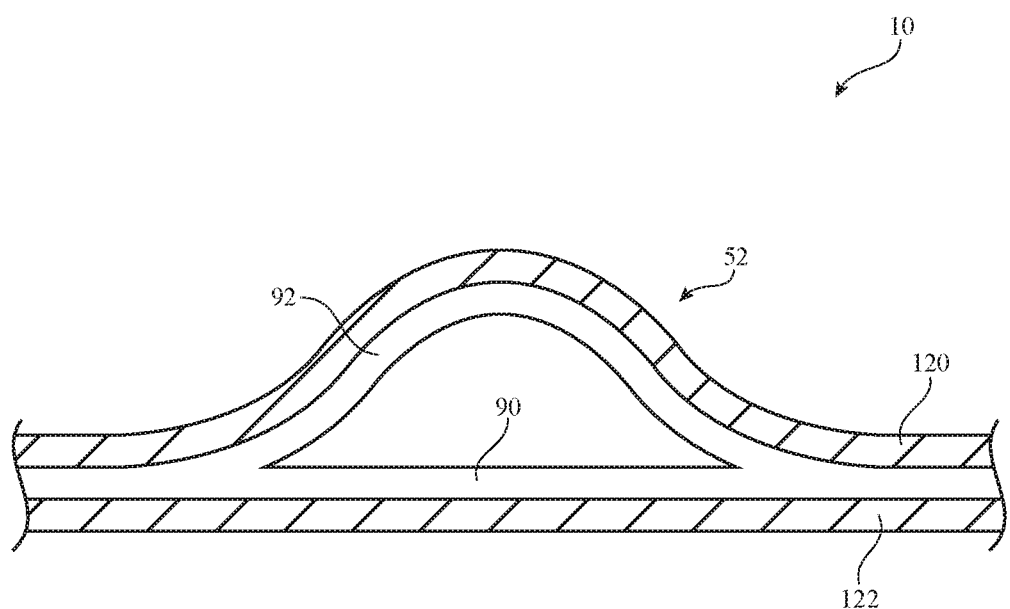
FIG. 23 is a cross-sectional side view of an illustrative fabric-based input device with layers such as plastic layers or additional fabric layers for protecting the fabric-based input device in accordance with an embodiment.

FIG. 23 is a cross-sectional side view of device 52 in item 10 in an arrangement in which fabric dome 92 and underlying layer 90 have been formed from fabric (e.g., integral portions of a fabric layer) and in which additional layers such as layers 120 and 122 have been formed respectively above and below fabric dome 92 and layer 90. Layers 120 and 122 may be formed from flexible polymers, from fabric, or other materials and may help protect dome 92 from moisture and dust.

Figure 24:
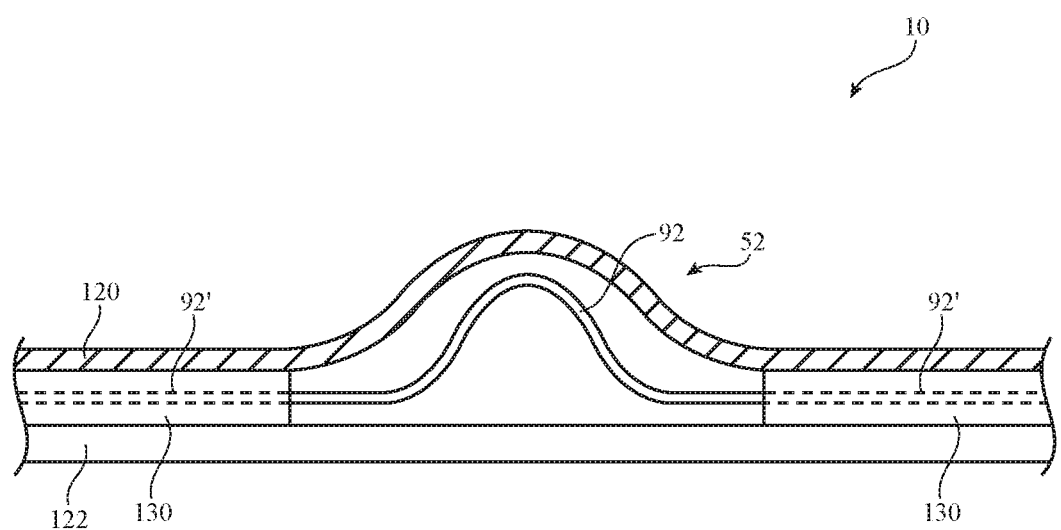
FIG. 24 is a cross-sectional side view of an illustrative fabric-based input device having a layer of fabric with a dome portion and portions that are embedded within a support structure such as a polymer layer in accordance with an embodiment.

In the illustrative configuration of FIG. 24, fabric dome 92 for device 52 is formed from a layer of fabric having portions 92' that are embedded within layer 130. Layer 130 may be an elastomeric polymer, a rigid polymer, or other suitable material. Layer 130 and fabric dome 92 may be interposed between layers 120 and 122, if desired.

Figure 25:
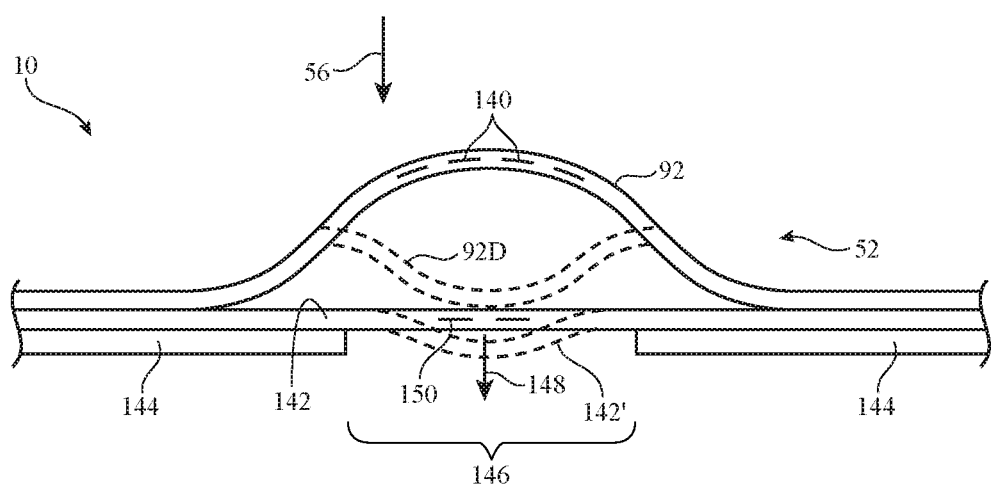
FIG. 25 is a cross-sectional side view of an illustrative fabric-based input device having a fabric dome and strain gauge structures in accordance with an embodiment.

Device 52 may be based on strain gauge structures. Consider, as an example, device 52 of FIG. 25. As shown in FIG. 25, device 52 may include fabric dome 92. Fabric dome 92 may be mounted on support structure 144. Layer 142 may be interposed between support structure 144 and the fabric that makes up dome 92. Layer 142 may be a flexible printed circuit layer, a fabric layer, or other substrate that contains serpentine metal traces or other structures that form strain gauge 150. Support structure 144 may be formed from a rigid printed circuit, fabric, a layer of polymer, or other support with an opening such as opening 146 that is aligned with strain gauge 150 and dome 92. When dome 92 is pressed in direction 56, the fabric of dome 92 may buckle and come into contact with layer 142, as illustrated by deformed portion 92D of dome 92. This may bend portion 142' of layer 142 and give rise to strain in portion 142'. Control circuitry 40 may use strain gauge 150 to measure the strain that is produced in portion 142' and strain gauge 150. Using this type of arrangement, the amount of force imposed in device 52 in direction 56 may be measured (i.e., device 52 may serve as a force detector). Strain gauge measurements may also be used in configurations in which device 52 serves as a switch. If desired, strain gauge structures may also be incorporated into dome 92, as indicated by strain gauge structures 140 (e.g., strands 12, metal traces, strain gauge structures attached to the fabric of dome 92, etc.).

In addition to using resistance measurements (e.g., measurements with circuitry 40 that determine whether a switch formed from electrodes 48 and 50 and associated buckling structures is opened or closed) and in addition to using force measurements of the type described in connection with FIG. 25, capacitance measurements may be made in device 52 (e.g., by measuring the capacitance between electrodes (terminals) 48 and 50). Capacitance measurements may reveal, for example, the amount of separation (distance) between electrodes 48 and 50. Capacitance measurements can be converted into binary switch state information (e.g., capacitance measurements may be compared to a predetermined capacitance threshold), may be converted into touch information (e.g., information indicating whether or not device 52 has been touched by a user's finger), may be converted into proximity sensor information (e.g., to determine whether a user's finger or other external object is within a predetermined distance of device 52), and/or may be converted into force information. Capacitance-based devices with fabric domes or other collapsible fabric structures such as device 52 may therefore serve as switches, force sensors, touch sensors, or proximity sensors.

The foregoing is merely illustrative and various modifications can be made by those skilled in the art without departing from the scope and spirit of the described embodiments. The foregoing embodiments may be implemented individually or in any combination.

What is claimed is:

1. An item, comprising:
   a first fabric layer that forms a fabric dome with a first conductive portion;
   a structure with a second conductive portion that is associated with the first conductive portion, wherein the structure defines a first plane;
   control circuitry coupled to the first and second conductive portions; and
   a second fabric layer overlapping the first fabric layer, wherein the second fabric layer completely covers the fabric dome, wherein the second fabric layer has first and second portions, wherein the first portion overlaps a center of the fabric dome and the second portion does not overlap the fabric dome, wherein the second portion defines a second plane that is parallel to the first plane, and wherein the first portion lies in the second plane.

2. The item defined in claim 1 wherein the structure with the second conductive portion comprises a layer of fabric.

3. The item defined in claim 1 wherein the first conductive portion is formed from conductive strands of material.

4. The item defined in claim 1 wherein the structure with the second conductive portion comprises fabric having insulating strands of material and conductive strands of material and wherein the second conductive portion is formed from the conductive strands of material.

5. The item defined in claim 1 wherein the first conductive portion is formed from conductive strands of material in the fabric dome and wherein the item comprises walls that serve as a case for an electronic device.

6. The item defined in claim 5 wherein the fabric dome and the structure with the second conductive portion form a switch on one of the walls of the case.

7. The item defined in claim 1 wherein the fabric dome and the structure form a switch and wherein the first and second conductive portions form first and second terminals for the switch, the item further comprising a keyboard key that includes the switch.

8. The item defined in claim 7 wherein the keyboard key comprises one of a plurality of keys in a keyboard each of which has a respective fabric dome.

9. The item defined in claim 1 further comprising a polymer layer, wherein the first fabric layer has portions embedded within the polymer layer.

10. The item defined in claim 1 further comprising speakers that are electrically coupled to the first and second conductive portions.

11. A fabric-based device, comprising:
    first and second contacts; and
    a fabric structure that buckles in response to applied pressure, wherein the fabric structure separates the first and second contacts by an air gap when the applied pressure is not present and the fabric structure is not buckled, wherein the first and second contacts contact each other and are electrically shorted to each other when the fabric structure is buckled in response to the applied pressure, and wherein the fabric structure comprises an open-topped fabric cone.

12. The fabric-based device defined in claim 11 wherein the fabric structure comprises a fabric dome having conductive strands that form the first contact.

13. The fabric-based device defined in claim 11 wherein the first contact is formed from first conductive strands and wherein the second contact is formed from second conductive strands.

14. The fabric-based device defined in claim 13 wherein the first and second conductive strands include dielectric cores and metal coatings on the dielectric cores.

15. An input device that a user controls by applying pressure with a finger, comprising:
    a fabric layer comprising a fabric dome having a first terminal, wherein the fabric layer has flat portions surrounding the fabric dome;

a second terminal that is separated by a gap from the first terminal when the finger is not applying the pressure and that is contacted by the first terminal in response to collapse of the fabric dome against the second terminal due to application of the pressure to the fabric dome with the finger; and an elastomeric material in which the flat portions of the fabric layer are embedded, wherein the fabric dome is uncovered by the elastomeric material to allow movement of the fabric dome relative to the elastomeric material.

16. The input device defined in claim 15 wherein the fabric dome comprises conductive strands that form the first terminal.

17. The input device defined in claim 16 wherein the input device is a switch that is open when the first and second terminals are separated by the gap and that is closed when the first terminal contacts the second terminal.

18. A force-based input device, comprising:

a fabric dome;

a strain gauge aligned with the fabric dome that senses when the fabric dome has been compressed against the strain gauge; and a support layer with an opening, wherein the strain gauge is aligned with the opening.

* * * * *